United States Patent [19]
Kobayashi

[11] Patent Number: 6,144,094
[45] Date of Patent: Nov. 7, 2000

[54] SEMICONDUCTOR DEVICE INCLUDING AN INSULATION FILM AND ELECTRODE HAVING NITROGEN ADDED THERETO

[75] Inventor: Kiyoteru Kobayashi, Tokyo, Japan

[73] Assignee: Mitsubishi Denki Kabushiki Kaisha, Tokyo, Japan

[21] Appl. No.: 08/948,043

[22] Filed: Oct. 9, 1997

[30] Foreign Application Priority Data

May 7, 1997 [JP] Japan .................................... 9-117027

[51] Int. Cl.⁷ .................................................... H01L 23/58
[52] U.S. Cl. .......................... 257/748; 257/914; 257/288; 257/356; 257/389; 257/410; 257/411; 257/506; 257/611; 257/649
[58] Field of Search ..................................... 257/748, 914, 257/288, 356, 410, 389, 411, 506, 611, 649

[56] References Cited

U.S. PATENT DOCUMENTS

| | | |
|---|---|---|
| 5,237,188 | 8/1993 | Iwai et al. . |
| 5,254,506 | 10/1993 | Hori ........................................ 437/241 |
| 5,489,542 | 2/1996 | Iwai et al. .................................. 437/41 |
| 5,866,930 | 2/1999 | Saida et al. ............................. 257/316 |
| 5,936,287 | 8/1999 | Gardner et al. .......................... 257/369 |

FOREIGN PATENT DOCUMENTS

| | | |
|---|---|---|
| 3-244125 | 10/1991 | Japan . |
| 4-199683 | 7/1992 | Japan . |
| 6-204465 | 7/1994 | Japan . |
| 6-349821 | 12/1994 | Japan . |
| 7-28041 | 3/1995 | Japan . |

OTHER PUBLICATIONS

T. Kuroi et al. (1994 Symposium on VSLI Technology, Digest of Technical Papers, p. 107), 1994.
T. Kuroi et al. (1994 Symposium on VSLI Technology, Digest of Techinal Papers, p. 107).
L. K. Han et al. (Technical Digest of International Electron Device Meeting, p. 617, 1994).
D. Wristers et al. (Appl. Phys. Lett., vol. 68, p.2094, 1994).

*Primary Examiner*—David Hardy
*Assistant Examiner*—Matthew E. Warren
*Attorney, Agent, or Firm*—McDermott, Will & Emery

[57] ABSTRACT

A semiconductor device comprising:
  a silicon substrate having a primary plane;
  an insulation film formed on the primary plane of the silicon substrate by subjecting the silicon substrate to thermal oxidation in an atmosphere of a gas of $N_2O$ or a mixing gas of $N_2O$ and $O_2$; and
  an electrode formed on the insulation film and having nitrogen and a p-type dopant added therein.

3 Claims, 16 Drawing Sheets

FIGURE 12 (PRIOR ART)
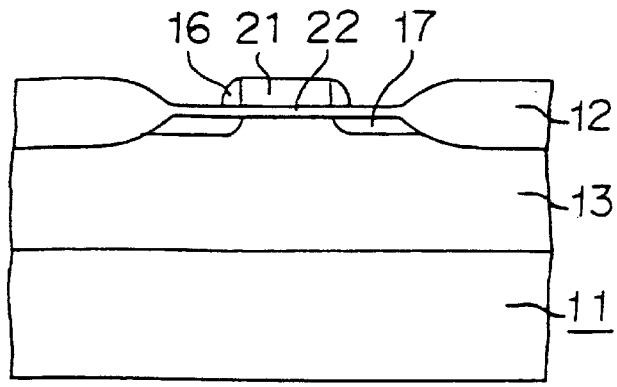
FIGURE 13 (a) (PRIOR ART)
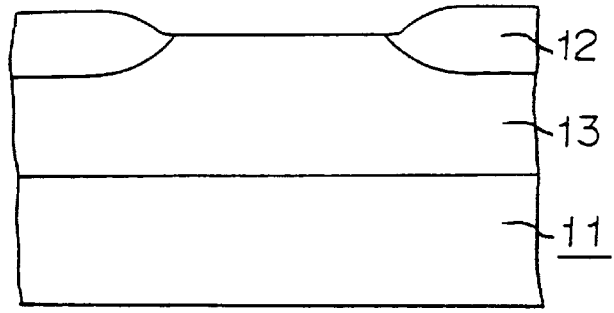
FIGURE 13 (b) (PRIOR ART)
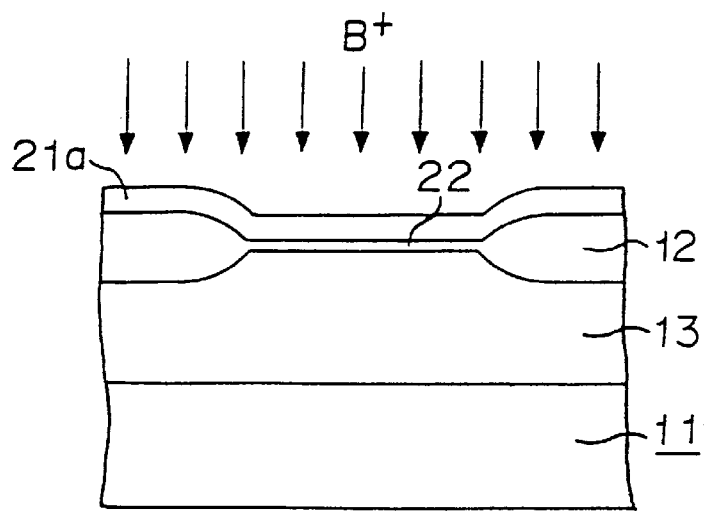

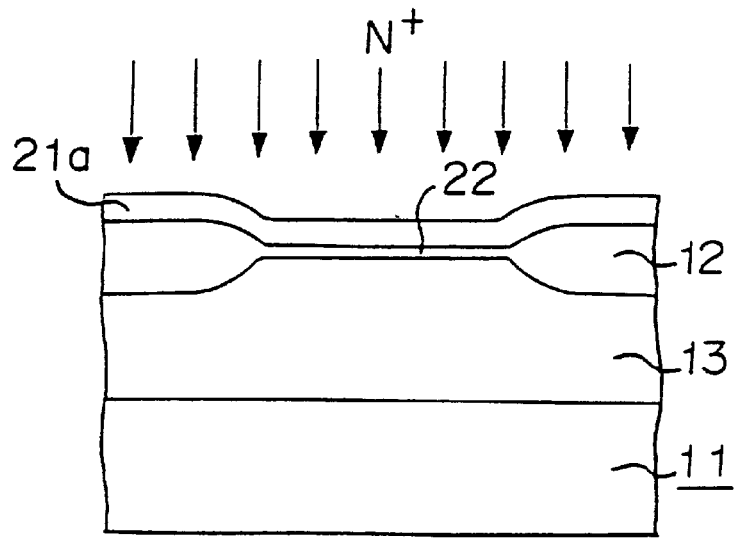
FIGURE 14 (a) (PRIOR ART)
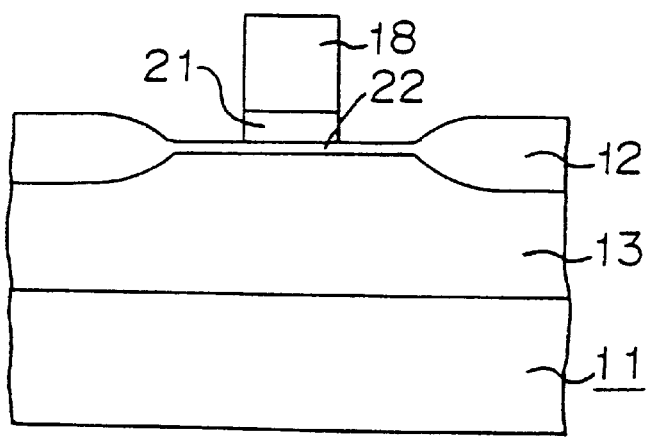
FIGURE 14 (b) (PRIOR ART)
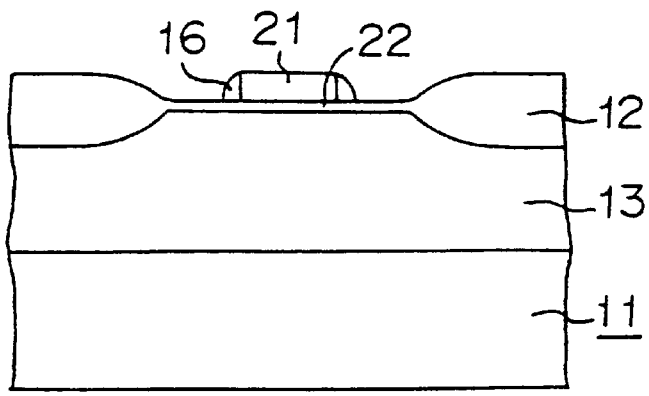
FIGURE 14 (c) (PRIOR ART)

FIGURE 17 (PRIOR ART)
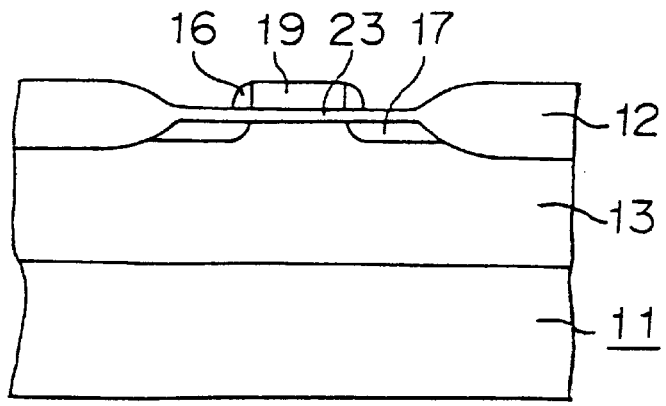
FIGURE 18 (a) (PRIOR ART)
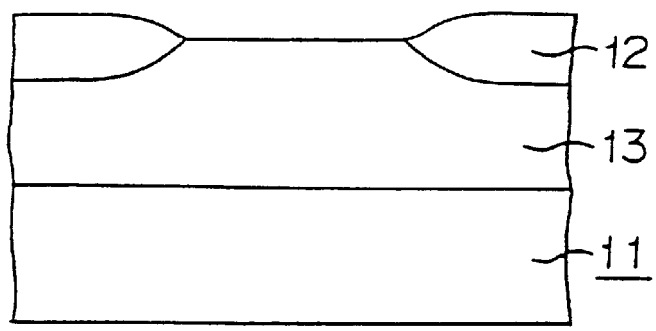
FIGURE 18 (b) (PRIOR ART)
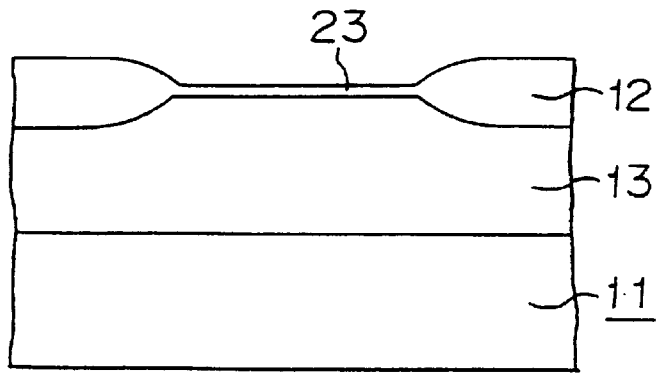

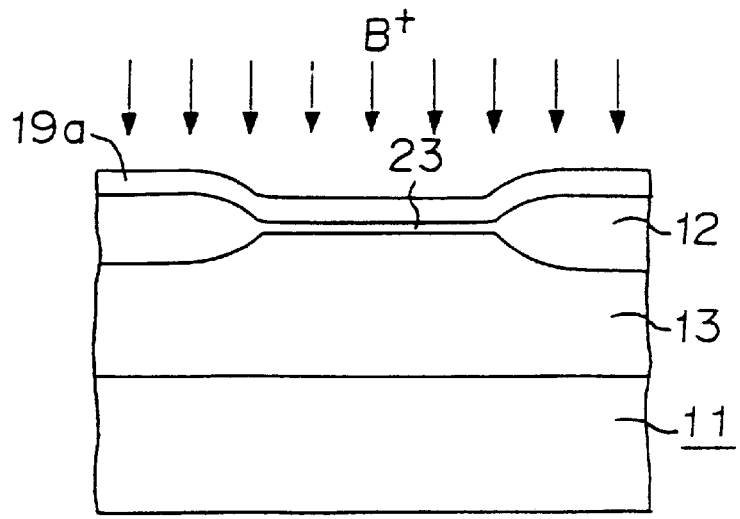
FIGURE 19 (a) (PRIOR ART)
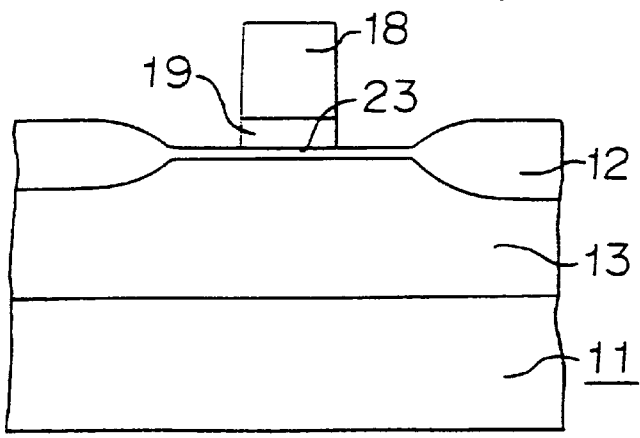
FIGURE 19 (b) (PRIOR ART)
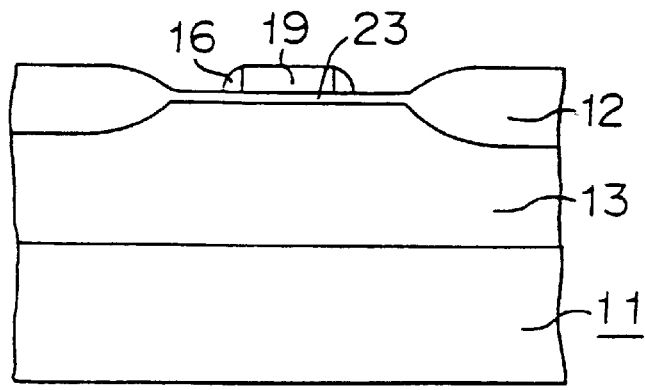
FIGURE 19 (c) (PRIOR ART)

FIGURE 23 (PRIOR ART)
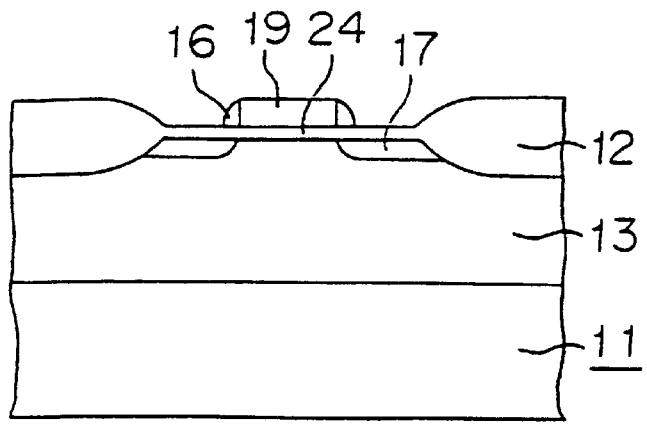
FIGURE 24 (a) (PRIOR ART)
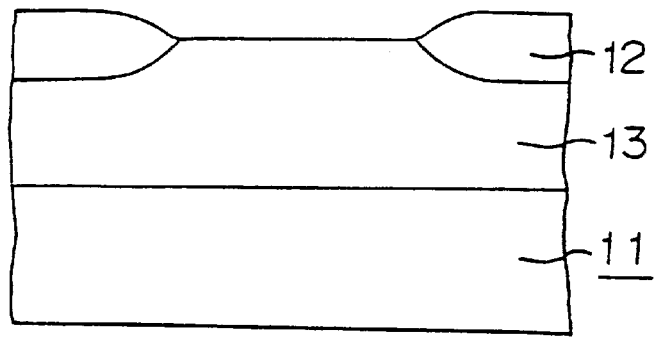
FIGURE 24 (b) (PRIOR ART)
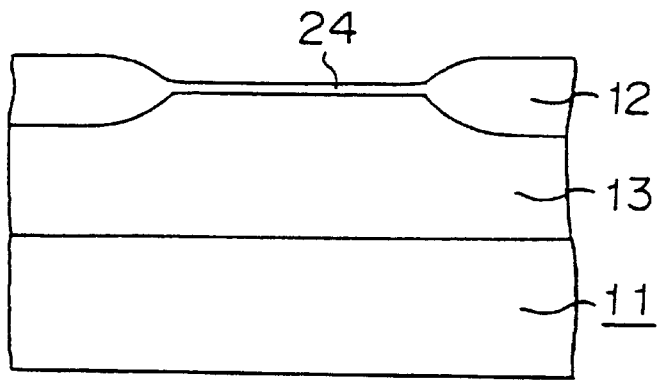

FIGURE 25 (a) (PRIOR ART)
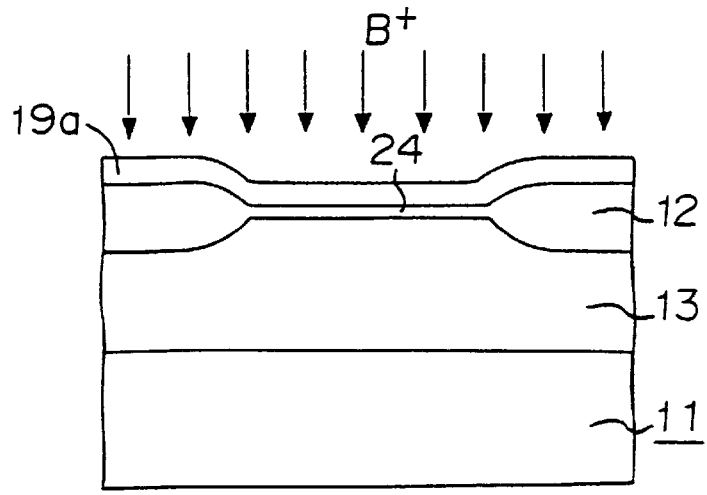
FIGURE 25 (b) (PRIOR ART)
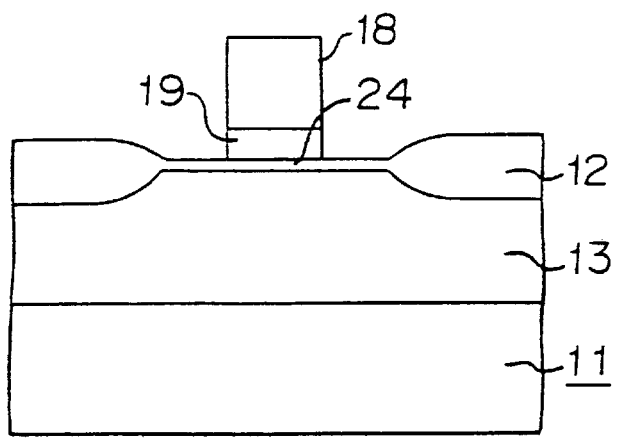
FIGURE 25 (c) (PRIOR ART)
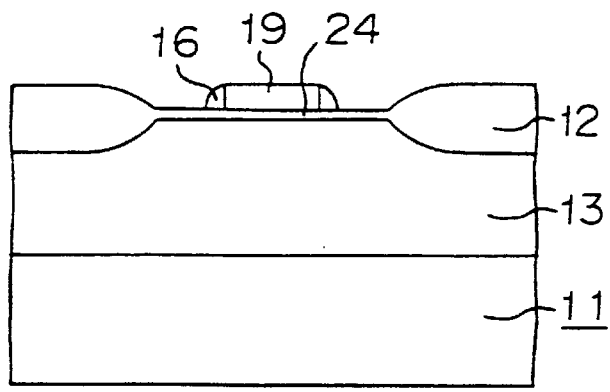

SEMICONDUCTOR DEVICE INCLUDING AN INSULATION FILM AND ELECTRODE HAVING NITROGEN ADDED THERETO

BACKGROUND OF THE INVENTION

1. Field of the Invention

The present invention relates to a semiconductor device and a method for fabricating it, in particular, a semiconductor device which includes an electrical element having a gate electrode with a p-type dopant added therein, and a method for fabricating the semiconductor device.

2. Discussion of Background

In FIG. 6, there is shown a cross-sectional view of essential parts of an example of a conventional p-channel MOS transistor (PMOS transistor). In FIG. 6, reference numeral 11 designates a p-type silicon substrate, reference numeral 12 designates an isolation oxide film which is formed on a primary plane of the p-type silicon substrate 11, reference numeral 13 designates an n-well which is formed on the primary plane of the p-type silicon substrate, reference numeral 14 designates a gate oxide film which is formed on the primary plane of the p-type silicon substrate 11, and reference numeral 15 designates a gate electrode which is a polysilicon film formed on the gate oxide film 14 and is doped n-type. Reference numeral 16 designates a sidewall oxide film which is formed on each of sides of the gate electrode 15 of the PMOS transistor, and reference numeral 17 designates p-type doped source/drain regions which are formed on the primary plane of the p-type silicon substrate 11 so as to sandwich the gate electrode 15 therebetween.

A fabrication process for the PMOS transistor shown in FIG. 6 will be explained in the order of the fabrication sequence with reference to the FIGS. 7 and 8.

First, as shown in FIG. 7(a), the isolation oxide film 12 is deposited on the primary plane of the p-type silicon substrate 11, and the n-well 13 is formed by ion implantation.

Next, as shown in FIG. 7(b), the p-type silicon substrate 11 is subjected to thermal oxidation at 900° C. by a lamp annealer in an atmosphere of $O_2$ gas to grow the gate oxide film 14. After that, a phosphorus doped polysilicon film 15a having a film thickness of about 2000 Å is deposited by a low pressure CVD method.

Subsequently, as shown in FIG. 8(a), a resist mask 18 is formed by photolithography, and the polysilicon film 15a is patterned in a desired form by anisotropic etching to form the gate electrode 15.

Next, as shown in FIG. 8(b), a silicon oxide film is deposited by a low pressure CVD method, and the deposited silicon oxide film is etched back to form the sidewall oxide film 16 on each of the sides of the gate electrode 15.

Next, as shown in FIG. 8(c), ions of boron fluoride are implanted with a dose of $4 \times 10^{15}$ cm$^{-2}$ at an energy of 20 KeV.

After that, heat treatment is carried out at 900° C. for 30 minutes in an atmosphere of $N_2$ gas to form the p-type doped source/drain regions 17, thus providing the PMOS transistor shown in FIG. 6.

It is effective to use a p-type doped electrode in order to suppress the short channel effect of a PMOS transistor. In FIG. 9, there is shown a cross-sectional view of essential parts of an example of a PMOS transistor which has such a feature.

In FIG. 9, reference numeral 11 designates a p-type silicon substrate, reference numeral 12 designates an isolation oxide film which is formed on a primary plane of the p-type silicon substrate 11, reference numeral 13 designates an n-well which is formed on the primary plane of the p-type silicon substrate 11, reference numeral 20 designates a gate oxide film which is formed on the primary plane of the p-type silicon substrate 11, and reference numeral 19 designates a gate electrode which is a polysilicon film formed on the gate oxide film 20 and is doped p-type. Reference numeral 16 designates a sidewall oxide film which is formed on each of sides of the gate electrode 19 of the PMOS transistor, and reference numeral 17 designates p-type doped source/drain regions which are formed on the primary plane of the p-type silicon substrate 11 so as to sandwich the gate electrode 19 therebetween.

Next, a fabrication process for the PMOS transistor shown in FIG. 9 will be explained in the order of the fabrication sequence with reference to FIGS. 10 and 11.

First, as shown in FIG. 10(a), the isolation oxide film 12 is deposited on the primary plane of the p-type silicon substrate 11, and the n-well 13 is formed by ion implantation.

Next, as shown in FIG. 10(b), the p-type silicon substrate 11 is subjected to thermal oxidation at 900° C. by a lamp annealer in an atmosphere of $O_2$ gas to grow the gate oxide film 20. After that, a polysilicon film 19a having a film thickness of about 2000 Å is deposited by a low pressure CVD method. Next, ions of boron are implanted into the polysilicon film 19a with a dose of $4 \times 10^{15}$ cm$^{-2}$ at an energy of 10 KeV.

Subsequently, as shown in FIG. 11(a), a resist mask 18 is formed by photolithography, and the polysilicon film 19a is patterned in a desired form by anisotropic etching to form the gate electrode 19.

Next, as shown in FIG. 11(b), a silicon oxide film is deposited by a low pressure CVD method, and the deposited silicon oxide film is etched back to form the sidewall oxide film 16 on each of sides of the gate electrode 19.

Next, as shown in FIG. 11(c), ions of boron fluoride are implanted with dose of $4 \times 10^{15}$ cm$^{-2}$ at an energy of 20 KeV.

After that, heat treatment is carried out at 900° C. for 30 minutes in an atmosphere of $N_2$ gas to form the p-type doped source/drain regions 17, thus providing the PMOS transistor shown in FIG. 9.

In the PMOS transistor shown in FIG. 9, the boron doped in the polysilicon film 19a has been diffused by the heat treatment in the atmosphere of $N_2$ gas at 900° C. for 30 minutes, and has arrived at the n-well 13 through the gate oxide film 20, creating a problem in that the threshold of the PMOS transistor has varied.

It is effective to use a nitrogen doped electrode in order to suppress a variation in the threshold. In FIG. 12, there is shown a cross-sectional view of an example of a PMOS transistor having such an arrangement.

In FIG. 12, reference numeral 11 designates a p-type silicon substrate, reference numeral 12 designates an isolation oxide film which is formed on a primary plane of the p-type silicon substrate 11, reference numeral 13 designates an n-well which is formed on the primary plane of the p-type silicon substrate 11, reference numeral 22 designates a gate oxide film which is formed on the primary plane of the p-type silicon substrate 11, and reference numeral 21 designates a gate electrode which is a polysilicon film formed on the gate oxide film 22, and which is doped n-type and have nitrogen doped therein. Reference numeral 16 designates a sidewall oxide film which is formed on each of sides of the gate electrode 21 of the PMOS transistor. Reference numeral 17 designates p-type doped source/drain regions which are formed on the primary plane of the p-type silicon substrate 11 so as to sandwich the gate electrode 21 therebetween.

A fabrication process for the PMOS transistor shown in FIG. 12 will be explained in the order of the fabrication sequence with reference to FIGS. 13–15.

First, as shown in FIG. 13(a), the isolation oxide film 12 is deposited on the primary plane of the p-type silicon substrate 11, and the n-well 13 is formed by ion implantation.

Next, as shown in FIG. 13(b), the p-type silicon substrate 11 is subjected to thermal oxidation at 900° C. by a lamp annealer in an atmosphere of $O_2$ gas to grow the gate oxide film 22. After that, a polysilicon film 21a having a film thickness of about 2000 Å is deposited by a low pressure CVD method. Next, ions of boron are implanted into the polysilicon film 21a with a dose of $4 \times 10^{15}$ cm$^{-2}$ at an energy of 10 KeV.

Subsequently, as shown in FIG. 14(a), ions of nitrogen are implanted with a dose of $4 \times 10^{15}$ cm$^{-2}$ at an energy of 10 KeV.

Subsequently, as shown in FIG. 14(b), a resist mask 18 is formed by photolithography, and the polysilicon film 21 is patterned in a desired form by anisotropic etching to form the gate electrode 21.

Next, as shown in FIG. 14(c), a silicon oxide film is deposited by a low pressure CVD method, and the deposited silicon oxide film is etched back to form the sidewall oxide film 16 on each of sides of the gate electrode 21.

Next, as shown in FIG. 15, ions of boron fluoride are implanted with a dose of $4 \times 10^{15}$ cm$^{-2}$ at an energy of 20 KeV.

After that, heat treatment is carried out at 900° C. for 30 minutes in an atmosphere of $N_2$ gas to form the p-type doped source/drain regions 17, thus providing the PMOS transistor shown in FIG. 12.

In the PMOS transistor shown in FIG. 12, the boron doped in the polysilicon film 21b has been diffused by the heat treatment at 900° C. for 30 minutes in the atmosphere of $N_2$ gas, and has arrived near an interface between the gate oxide film 22 and the polysilicon film 21.

In FIG. 16, there is shown the distribution of the nitrogen in the polysilicon film 21, the gate oxide film 22 and the silicon substrate 11 of the PMOS transistor shown in FIG. 12, which was measured by SIMS (Secondary Ion Mass Spectroscopy) method. As shown in FIG. 16, the nitrogen is distributed in the interface between the polysilicon film 22 and the gate oxide film 21.

It is effective to use a silicon oxide film with nitrogen doped therein as another measure to suppress a variation in the threshold of the PMOS transistor. As a measure to form a gate oxide film with nitrogen doped therein, there is a method wherein a p-type silicon substrate is subjected to thermal oxidation at 900° C. by a lamp annealer in an atmosphere of $O_2$ gas, and heat treatment is subsequently carried out in an atmosphere of NO gas to grow the gate oxide film with nitrogen included therein.

In FIG. 17, there is shown a cross-sectional view of the essential parts of an example of a PMOS transistor which has been fabricated in such a method. Reference numeral 11 is a p-type silicon substrate, reference numeral 12 designates an isolation oxide film which is formed on a primary plane of the p-type silicon substrate 11, reference numeral 13 designates an n-well which is formed on the primary plane of the p-type silicon substrate 11, reference numeral 23 designates a gate oxide film which is formed on the primary plane of the p-type silicon substrate 11 and includes nitrogen, and reference numeral 19 designates a gate electrode which is a polysilicon film formed on the gate oxide film 23 and is doped p-type. Reference numeral 16 designates a sidewall oxide film which is formed on each of sides of the gate electrode 19 of the PMOS transistor. Reference numeral 17 designates p-type doped source/drain regions which are formed on the primary plane of the p-type silicon substrate 11 so as to sandwich the gate electrode 19 therebetween.

A fabrication process for the PMOS transistor shown in FIG. 17 will be explained in the order of the fabrication sequence with reference to FIGS. 18–20. First, as shown in FIG. 18(a), the isolation oxide film 12 is deposited on the primary plane of the p-type silicon substrate 11, and the n-well 13 is formed by ions implantation.

Next, as shown in FIG. 18(b), the p-type silicon substrate is subjected to thermal oxidation at 900° C. by a lamp annealer in an atmosphere of $O_2$ gas, and heat treatment is subsequently carried out in an atmosphere of NO gas to grow the gate oxide film 23 with nitrogen included therein.

After that, as shown in FIG. 19(a), a polysilicon film 19a having a film thickness of about 2000 Å is deposited by a low pressure CVD method. Next, ions of boron are implanted into the polysilicon film 19a with a dose of $4 \times 10^{15}$ cm$^{-2}$ at an energy of 10 KeV.

Subsequently, as shown in FIG. 19(b), a resist mask 18 is formed by photolithography, and the polysilicon film 19a is patterned in a desired form by anisotropic etching to form the gate electrode 19.

Next, as shown in FIG. 19(c), a silicon oxide film is deposited by a low pressure CVD method, and the deposited silicon oxide film is etched back to form the sidewall oxide film 16 on each of the sides of the gate electrode 19.

Next, as shown in FIG. 20, ions of boron fluoride are implanted with a a dose of $4 \times 10^{15}$ cm$^{-2}$ at an energy of 20 KeV.

After that, heat treatment is carried out at 900° C. for 30 minutes in an atmosphere of $N_2$ gas to form the p-type doped source/drain regions 17, thus providing the PMOS transistor shown in FIG. 17.

Next, in FIG. 21, there is shown the distribution of the nitrogen in the gate oxide film 23 and the silicon substrate 11 of the PMOS transistor shown in FIG. 17, which was measured by the SIMS method. As shown, the nitrogen has been distributed in the interface of the gate oxide film 23 and the silicon substrate 11.

The gate oxide films 20, 22 and 23 of the PMOS transistors shown in FIGS. 9, 12 and 17 create a problem in that these gate oxide films have a shorter dielectric breakdown time than the gate oxide film 14 of the PMOS transistor shown in FIG. 6.

In FIG. 22, there are shown graphs of the dielectric breakdown time of each of the gate oxide films 14, 20, 22 and 23 of the PMOS transistors shown in FIGS. 6, 9, 12 and 17, which were measured in such conditions that a negative voltage was applied to each of the gate electrodes of the PMOS transistors and that each of the silicon substrates of the PMOS transistors was grounded. The gate oxide films 14, 20, 22 and 23 had a film thickness of about 60 Å, and the average electric field in the gate electrodes was 12 MV/cm.

As seen from the comparison of the gate oxide films 14 and 20 in FIG. 22, the use of the boron doped electrode 19 as the gate electrode of the PMOS transistor creates a problem in that the dielectric breakdown time of the gate oxide film 20 degrades. This has been reported by D. Wristers et al. (Appl. Phys. Lett., vol. 68, p. 2094, 1996), according to which the diffusion of boron into the gate oxide film 20 degrades the dielectric breakdown time in the case of the boron doped gate electrode 19.

As seen from FIG. 22, the dielectric breakdown time of the gate oxide film 22 in the structure with the gate electrode 21 including nitrogen can not be improved with comparison with the gate oxide film 20 either.

This has been reported by T. Kuroi et al. (1994 Symposium on VLSI Technology, Digest of Technical Papers, p. 107), according to which the nitrogen is distributed in the interface of the gate electrode and the gate oxide film to suppress the diffusion of boron in the gate electrode 21 into the interface of the gate oxide film and the silicon substrate by doping nitrogen into the polysilicon film 21a for the gate electrode and carrying out heat treatment.

However, the dielectric breakdown time can not be improved even in this case. It is supposed that only introduction of boron into the gate oxide film 22 from the gate electrode 21 is not enough to prevent the invasion of boron in order to improve the dielectric breakdown time of the gate oxide film 22.

If the nitrogen concentration in the gate electrode 21 is raised in order to improve the dielectric breakdown time, the resistance in the gate electrode 21 is increased to lower the performance of the PMOS transistor. There is a limitation to the nitrogen concentration in the gate electrode 21.

As seen from the comparison of the gate oxide films 20 and 23 shown in FIG. 22, the dielectric breakdown time is not improved for the gate oxide film 23 with nitrogen included. It is shown that the dielectric breakdown time of the gate oxide film 23 has lowered.

The comparison of the gate oxide films 20 and 23 shows that when an oxide film formed by $O_2$ gas is nitrided by NO gas, nitrogen is distributed in the interface of the gate oxide film and the silicon substrate as shown in FIG. 21. According to D. Wristers et al. (Appl. Phys. Lett., vol. 68, p. 2094, 1996), it has been reported that when the boron in the gate electrode 19 is diffused to the gate oxide film 23, the dielectric breakdown time of the gate oxide film 23 is lowered than that of the gate oxide film 20 without nitrogen.

It has been pointed out that in the gate oxide film 23 with nitrogen distributed in the gate oxide film/silicon substrate interface, the nitrogen works as a barrier to boron diffusion from the gate oxide film 23 to the silicon substrate and the boron is accumulated in the gate oxide film 23.

According to L. K. Han et al. (Technical Digest of International Electron Device Meeting, p. 617, 1994), it has been reported that when a gate electrode is made of phosphorus doped polysilicon, the introduction of nitrogen into a gate oxide film can reduce the amount of distorted bonds in the oxide film near the interface of the oxide film and a silicon substrate to improve the dielectric breakdown time.

As explained, it is important that the film properties near the interface of a gate oxide film and a silicon substrate are improved with respect to the dielectric breakdown of the oxide film. Considering these reports, it is supposed that in the gate oxide film 23 with nitrogen distributed in the interface of the gate oxide film and the silicon substrate, boron is diffused in the oxide film near the interface of the gate oxide film and the silicon substrate to lower the dielectric breakdown time.

In order to overcome the problems stated earlier, there is the following improvement:

In FIG. 23, there is shown a cross-sectional view of essential parts of an improved PMOS transistor. In FIG. 23, reference numeral 11 designates a p-type silicon substrate, reference numeral 12 designates an isolation oxide film which is formed on a primary plane of the p-type silicon substrate 11, reference numeral 13 designates an n-well which is formed on the primary plane of the p-type silicon substrate 11, reference numeral 24 designates a gate oxide film which is formed on the primary plane of the p-type silicon substrate 11 and includes nitrogen, and reference numeral 19 designates a gate electrode which is a polysilicon film formed on the gate oxide film 24 and is doped p-type. Reference numeral 16 designates a sidewall oxide film which is formed on each of sides of the gate electrode 19 of the PMOS transistor. Reference numeral 17 designates p-type doped source/drain regions which are formed on the primary plane of the p-type silicon substrate 11 so as to sandwich the gate electrode 19 therebetween.

A fabrication process for the PMOS transistor shown in FIG. 23 will be explained in the order of the fabrication sequence with reference to FIGS. 24–26.

First, as shown in FIG. 24(a), the isolation oxide film 12 is formed on the primary plane of the p-type silicon substrate 11, and the n-well 13 is formed by ion implantation.

Next, as shown in FIG. 24(b), the p-type silicon substrate 11 is subjected to thermal oxidation at 900° C. by a lamp annealer in an atmosphere of mixing gas of $N_2O$ and $O_2$ ($N_2O:O_2$=1:1 in terms of a ratio of flow rate) to grow the gate oxide film 24.

After that, as shown in FIG. 25(a), a polysilicon film 19a having a film thickness of about 2000 Å is deposited by a low pressure CVD method. Next, ions of boron are implanted into the polysilicon film 19a with a dose of $4\times10^{15}$ cm$^{-2}$ at an energy of 10 KeV.

Subsequently, as shown in FIG. 25(b), a resist mask 18 is formed by photolithography, and the polysilicon film 19a is patterned in a desired form by anisotropic etching to form the gate electrode 19.

Next, as shown in FIG. 25(c), a silicon oxide film is deposited by a low pressure CVD method, and the deposited silicon oxide film is etched back to form the sidewall oxide film 16 on each of the sides of the gate electrode 19.

Next, as shown in FIG. 26, ions of boron fluoride are implanted with a dose of $4\times10^{15}$ cm$^{-2}$ at an energy of 20 KeV.

After that, heat treatment is carried out at 900° C. for 30 minutes in an atmosphere of $N_2$ gas to form the p-type doped source/drain regions 17, thus providing the PMOS transistor shown in FIG. 23.

In FIG. 27, there is shown the distribution of the nitrogen in the gate oxide film 24 and the silicon substrate 11 of the PMOS transistor shown in FIG. 23, which was measured by the SIMS method. The nitrogen is distributed in a substantially central portion of the gate oxide film 24.

In FIG. 28, there are shown graphs of the dielectric breakdown time of each of the gate oxide films 14, 20, 22, 23 and 24 of the PMOS transistor shown in FIGS. 6, 9, 12, 17 and 23, which were measured in such conditions that a negative voltage was applied to each of the gate electrodes of the PMOS transistors and that each of the silicon substrates of the PMOS transistors was grounded. The gate oxide films 14, 20, 22, 23 and 24 had a film thickness of about 60 Å, and the average electric field in the gate oxide films was 12 MV/cm.

As seen from FIG. 28, the gate oxide films 20, 22, 23 and 24 had the dielectric breakdown time lowered in comparison with the gate oxide film 14. However, the gate oxide film 24 had the dielectric breakdown time relatively extended in comparison with the gate oxide films 20, 22 and 23.

It is supposed that in the improved gate oxide film 24 which was formed by subjecting the silicon substrate 11 to thermal oxidation in the atmosphere of the mixing gas of $N_2O$ and $O_2$, the distribution of the nitrogen in the substantially central portion of the gate oxide film 24 as shown in FIG. 27 causes the nitrogen to work as a barrier to boron diffusion into the oxide film 24 near the interface between the gate oxide film and the silicon substrate.

However, the nitrogen concentration of the oxide film is too low to provide a sufficient suppression effect to boron diffusion, failing to ensure an enough sufficient dielectric breakdown time.

SUMMARY OF THE INVENTION

Considering the problems stated earlier, it is an object of the present invention to suppress a deterioration in the dielectric breakdown time of a gate oxide film introduced by boron diffusion from a gate electrode to improve the reliability of a semiconductor device.

According to a first aspect of the present invention, there is provided a semiconductor device comprising a silicon substrate having a primary plane;

an insulation film formed on the primary plane of the silicon substrate by subjecting the silicon substrate to thermal oxidation in an atmosphere of a gas of $N_2O$ or a mixing gas of $N_2O$ and $O_2$; and an electrode formed on the insulation film and having nitrogen and a p-type dopant added therein.

According to a second aspect of the present invention, the insulation film is formed by thermal oxidation using a lamp annealer.

According to a third aspect of the present invention, there is provided a semiconductor device comprising a silicon substrate having a primary plane;

a silicon oxide film formed on the primary plane of the silicon substrate; and an electrode formed on the oxidation film and having a p-type dopant included therein, wherein the silicon oxide film has a distribution of nitrogen concentration that peaks around a central portion of the silicon oxide film and near an interface between the silicon oxide film and the electrode.

According to a fourth aspect of the present invention, the nitrogen concentration around the central portion of the silicon oxide film has a peak value of not higher than 2 atomic %.

According to a fifth aspect of the present invention, the electrode comprises polysilicon including nitrogen.

According to a sixth aspect of the present invention, there is provided a method for fabricating a semiconductor device which comprises the steps of forming an insulation film on a primary plane of a silicon substrate by subjecting the silicon substrate to thermal oxidation in an atmosphere of a gas of $N_2O$ or a mixing gas of $N_2O$ and $O_2$;

forming an electrode on the insulation film, the electrode having nitrogen and a p-type dopant included therein, and;

thermally diffusing the nitrogen in the electrode into the insulation film.

According to a seventh aspect of the present invention, there is provided the step of forming the insulation film includes use of a lamp annealer.

According to an eighth aspect of the present invention, the step of forming the electrode with the nitrogen includes use of ion implantation.

In accordance with the first aspect of the present invention, the amount of the p-type dopant in the electrode which arrives at an interface between the insulation film and the silicon substrate can be suppressed to restrain the dielectric breakdown of the insulation film, improving the reliability of the semiconductor device.

In accordance with the second aspect, the insulation film can be formed with a high throughput at the time of forming of the semiconductor layer.

In accordance with the third aspect, the amount of the p-type dopant in the electrode which arrives at the interface between the silicon oxide film and the silicon substrate can be suppressed to restrain the dielectric breakdown of the silicon oxide film, improving the reliability of the semiconductor device.

In accordance with the fourth aspect, there is offered an advantage in that no crystal defect occurs in the wafer.

In accordance with the fifth aspect, there are offered advantages in that the fabrication of the semiconductor device is easy and in that the fabrication can be made at a low cost.

In accordance with the sixth aspect, the amount of the p-type dopant in the electrode which arrives at an interface between the insulation film and the silicon substrate can be suppressed to restrain the dielectric breakdown of the insulation film, improving the reliability of the semiconductor device.

According to the seventh aspect, there is offered an advantage in that the insulation film can be formed with a high throughput.

In accordance with the eighth aspect, the fabrication of the semiconductor device is easy.

BRIEF DESCRIPTION OF THE DRAWINGS

FIG. 12 is a cross-sectional view of essential parts of another conventional semiconductor device;

FIGS. 13(a) and (b) are cross-sectional views showing a fabrication process for the semiconductor device of FIG. 12;

FIGS. 14(a)–(c) are cross-sectional views showing the fabrication process for the semiconductor device of FIG. 12 in the order of the fabrication sequence;

FIG. 17 is a cross-sectional view showing essential parts of another conventional semiconductor device;

FIGS. 18(a) and (b) are cross-sectional views showing a fabrication process for the semiconductor device of FIG. 17 in the order of the fabrication sequence;

FIGS. 19(a)–(c) are cross-sectional views showing the fabrication process for the semiconductor device of FIG. 17 in the order of the fabrication sequence;

FIG. 23 is a cross-sectional view showing essential parts of an improved semiconductor device;

FIGS. 24(a) and (b) are cross-sectional views showing a fabrication process for the improved semiconductor device in the order of the fabrication sequence;

FIGS. 25(a)–(c) are cross-sectional views showing the fabrication process for the improved semiconductor device in the order of the fabrication sequence;

DESCRIPTION OF THE PREFERRED EMBODIMENT

Figure 1:
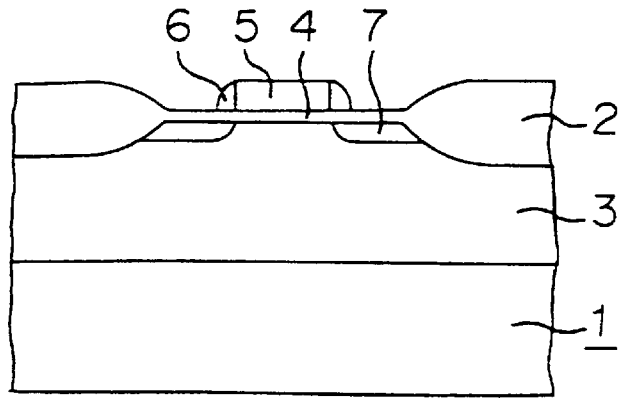
FIG. 1 is a cross-sectional view of essential parts of the semiconductor device according to an embodiment of the present invention.

In FIG. 1, there is shown a cross-sectional view of essential parts of the semiconductor device according to an embodiment of the present invention.

In FIG. 1, reference numeral 1 designates a p-type silicon substrate, reference numeral 2 designates an isolation oxide film which is formed on a primary plane of the p-type silicon substrate, reference numeral 3 designates an n-well which is formed on the primary plane of the p-type silicon substrate 1, reference numeral 4 designates a gate oxide film which is formed on the primary plane of the p-type silicon substrate 1 and includes nitrogen, and reference numeral 5 designates a gate electrode which is a polysilicon film formed on the gate oxide film 4, and which is doped in p-type and has nitrogen doped therein. Reference numeral 6 designates a sidewall oxide film which is formed on each of sides of the gate electrode 5 of the PMOS transistor. Reference numeral 7 designates p-type doped source/drain regions which are formed on the primary plane of the p-type silicon substrate 1 so as to sandwich the gate electrode 5 therebetween.

Figure 2:
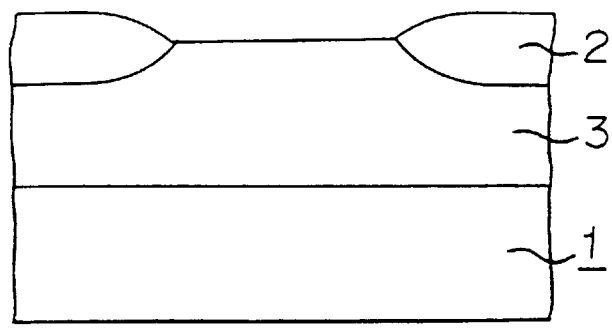
FIGS. 2(a) and (b) are cross-sectional views showing a fabrication process for the semiconductor device according to the first embodiment in the order of the fabrication sequence.
Figure 2:
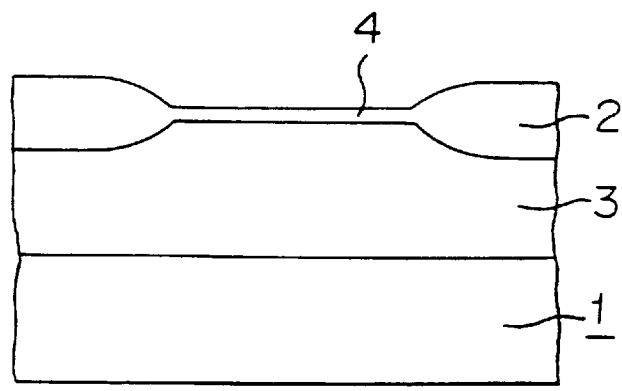
Figure 3:
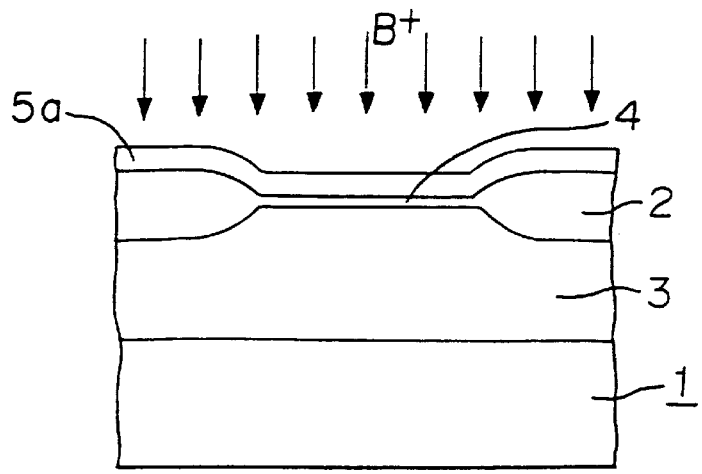
FIGS. 3(a)–(c) are cross-sectional views showing the fabrication process in the order of the fabrication sequence.
Figure 3:
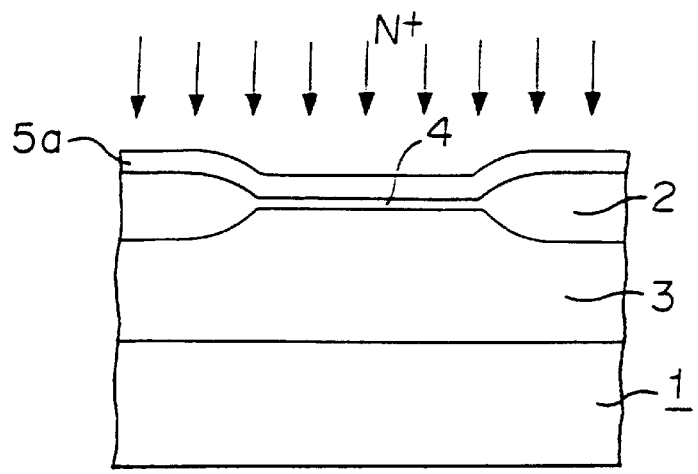
Figure 3:
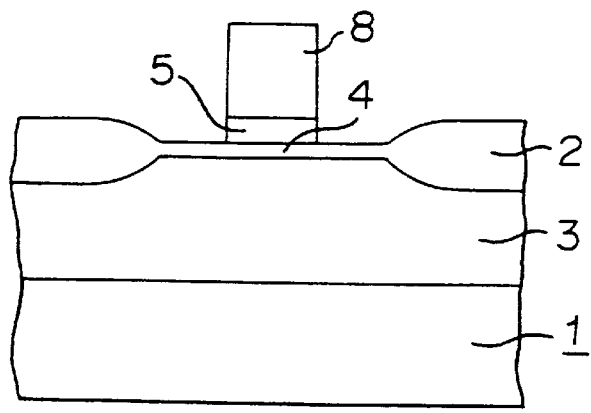
Figure 4:
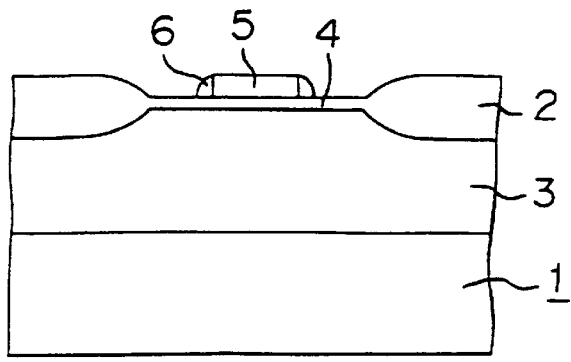
FIGS. 4(a) and (b) are cross-sectional views showing the fabrication process in the order of the fabrication sequence.
Figure 4:
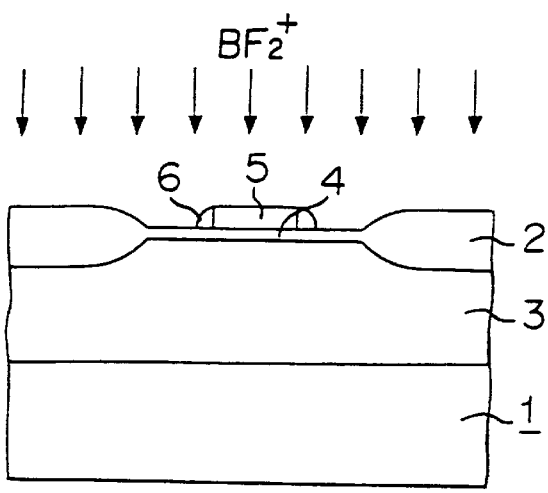

A fabrication process for the PMOS transistor shown in FIG. 1 will be explained in the order of the fabrication sequence with reference to FIGS. 2–4. First, as shown in FIG. 2(a), the isolation oxide film 2 is formed on the primary plane of the p-type silicon substrate 1, and the n-well 3 is formed by ion implantation.

Next, as shown in FIG. 2(b), the p-type silicon substrate 1 is subjected to thermal oxidation at 900° C. by a lamp annealer in an atmosphere of a mixing gas of $N_2O$ and $O_2$ ($N_2O:O_2=1:1$ in terms of a ratio of flow rate) to grow the gate oxide film 4.

The use of the lamp annealer allows the gate oxide film 4 to be formed with a high throughput.

After that, as shown in FIG. 3(a), a polysilicon film 5a having a film thickness of about 2000 Å is deposited by a low pressure CVD method. Next, ions of boron are implanted into the polysilicon film 5a with a dose of $4 \times 10^{15}$ $cm^{-2}$ at an energy of 10 KeV.

Subsequently, as shown in FIG. 3(b), ions of nitrogen is implanted with a dose of $4 \times 10^{15}$ $cm^{-2}$ at an energy of 10 KeV.

Subsequently, as shown in FIG. 3(c), a resist mask 8 is formed by photolithography, and the polysilicon film 5a is patterned in a desired form by anisotropic etching to form the gate electrode 5.

Next, as shown in FIG. 4(a), a silicon oxide film is deposited by a low pressure CVD method, and the deposited silicon oxide film is etched back to form the sidewall oxide film 6 on each of sides of the gate electrode film 5.

Next, as shown in FIG. 4(b), ions of boron fluoride are implanted with a dose of $4 \times 10^{15}$ $cm^{-2}$ at an energy of 20 KeV.

After that, heat treatment is carried out at 900° C. for 30 minutes in an atmosphere of a gas of $N_2$ to form the p-type doped source/drain regions 7, thus providing the PMOS transistor shown in FIG. 1.

Figure 5:
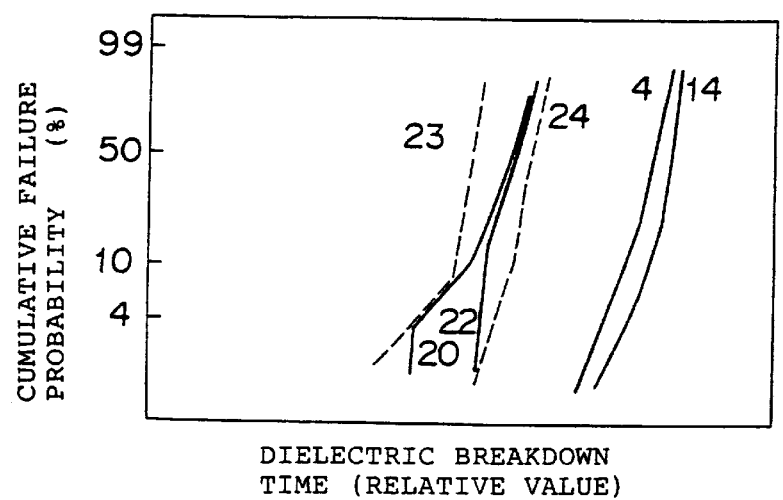
FIG. 5 is graphs showing measured dielectric breakdown times of gate oxide films in the first embodiment, the conventional device and the improvement.
Figure 6:
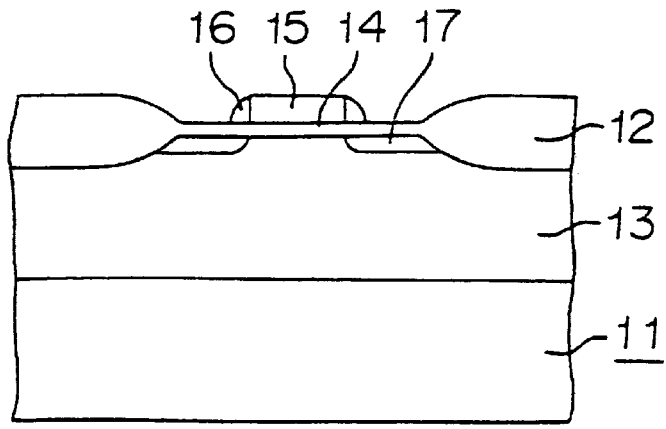
FIG. 6 is a cross-sectional view of essential parts of a conventional semiconductor device.
Figure 7:
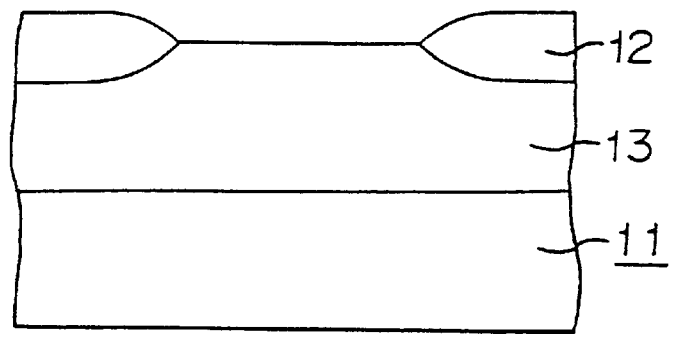
FIGS. 7(a) and (b) are cross-sectional views showing a fabrication process for the conventional semiconductor device in the order of the fabrication sequence.
Figure 7:
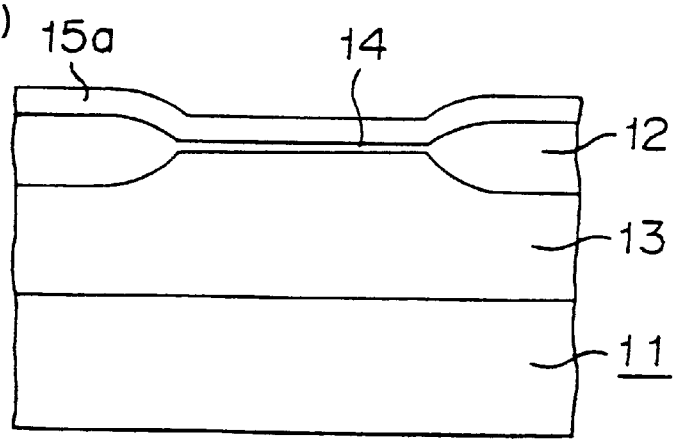
Figure 8:
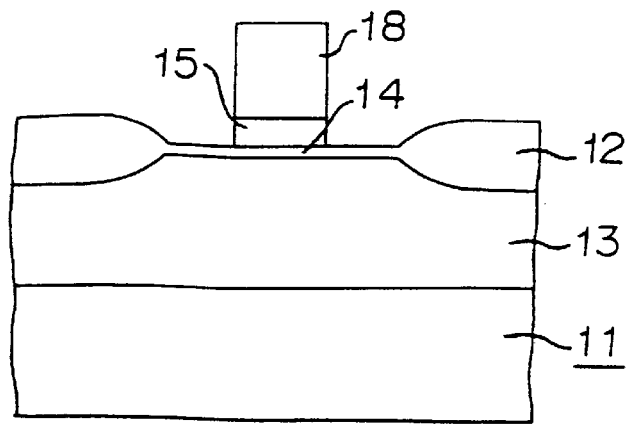
FIGS. 8(a)–(c) are cross-sectional views showing the fabrication process for the conventional semiconductor device in the order of the fabrication sequence.
Figure 8:
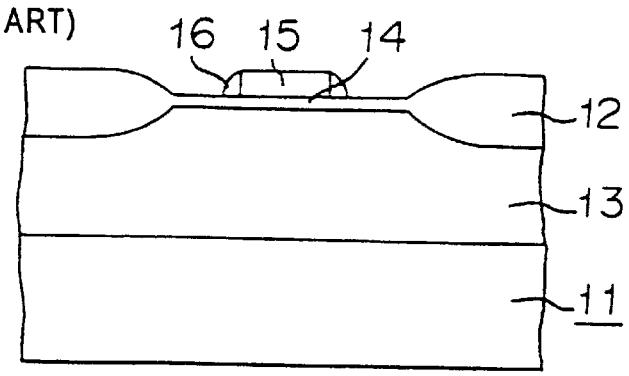
Figure 8:
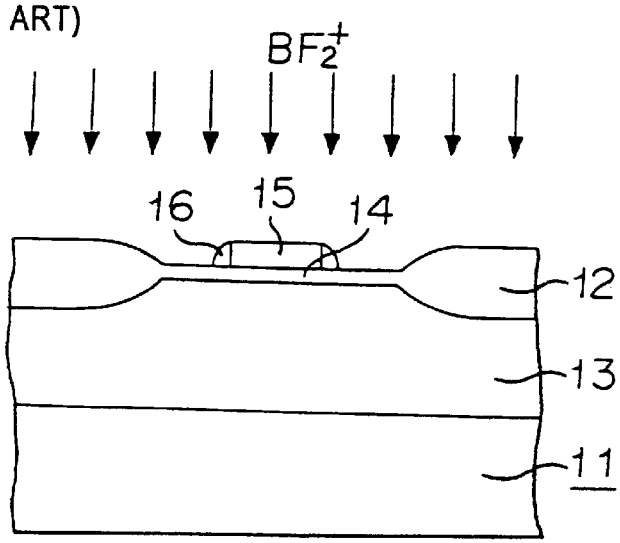
Figure 9:
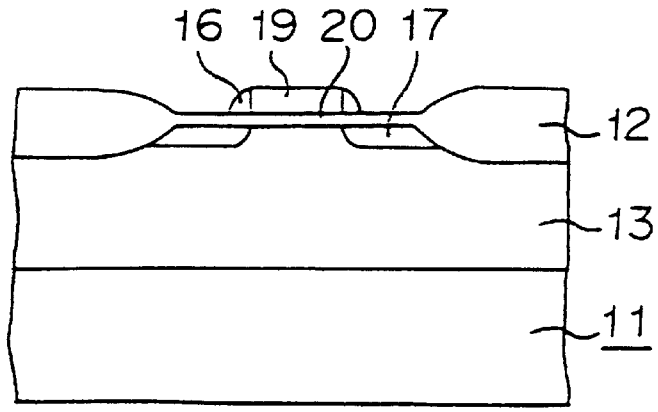
FIG. 9 is a cross-sectional view of essential parts of another conventional semiconductor device.
Figure 10:
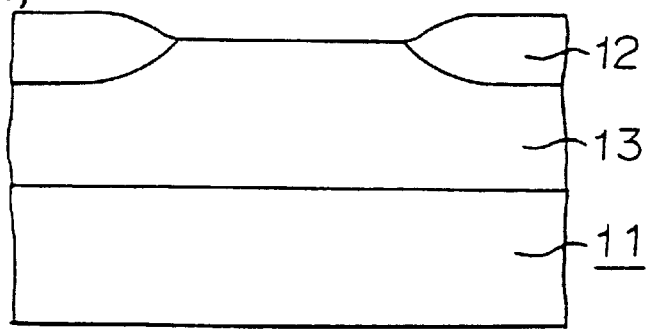
FIGS. 10(a) and (b) are cross-sectional views showing a fabrication process for the semiconductor device of FIG. 9 in the order of the fabrication sequence.
Figure 10:
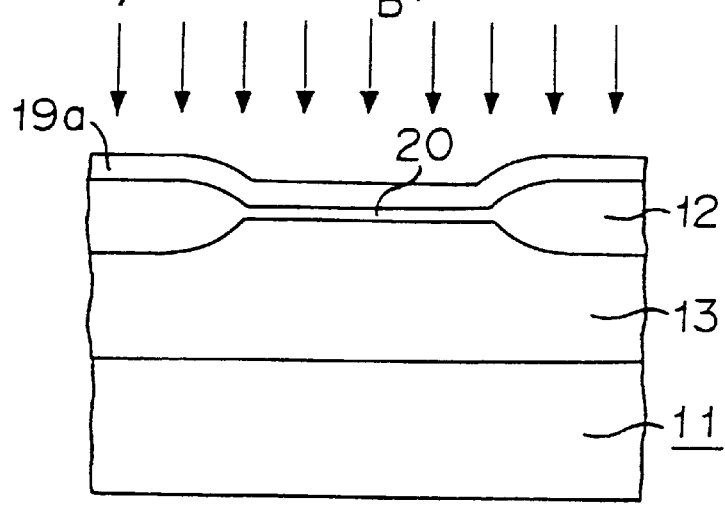
Figure 11A:
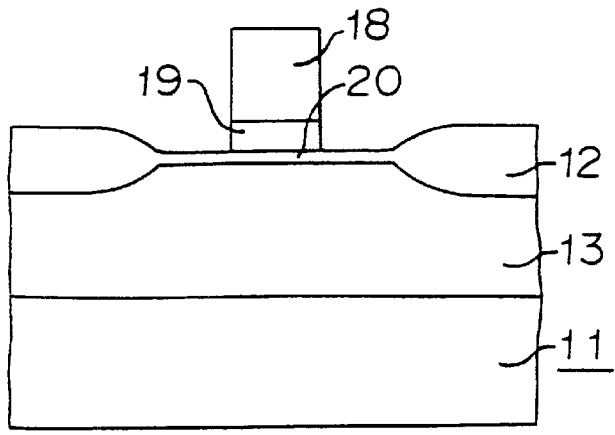
FIGS. 11(a)–(c) are cross-sectional views of essential parts showing the fabrication process for the semiconductor device of FIG. 9 in the order of the fabrication sequence.
Figure 11B:
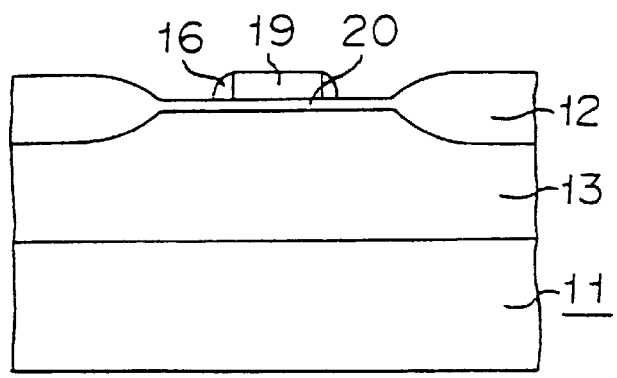
Figure 11C:
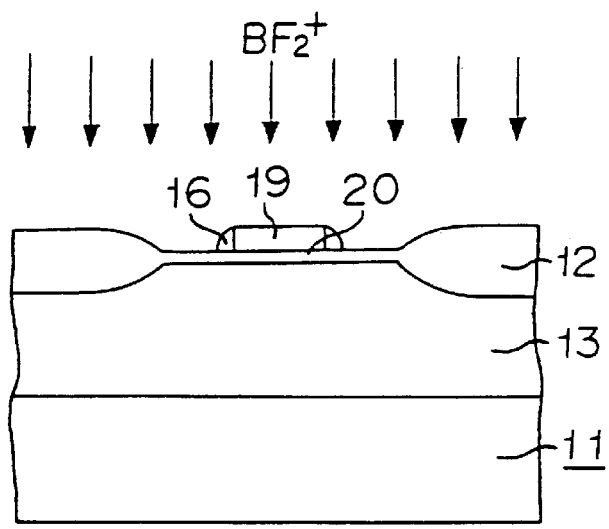
Figure 15:
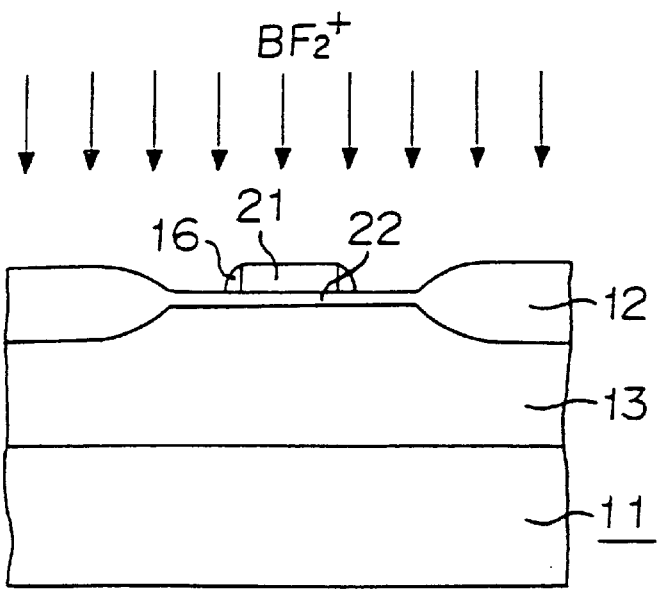
FIG. 15 is a cross-sectional view showing the fabrication process for the semiconductor device of FIG. 12 in the order of the fabrication sequence.
Figure 16:
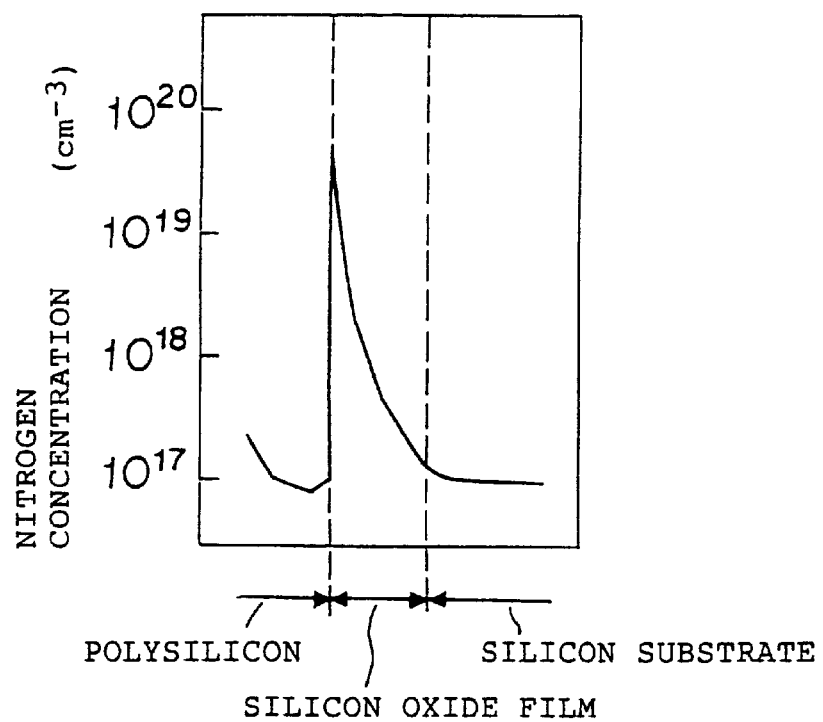
FIG. 16 is a graph showing a measured distribution of nitrogen concentration in the semiconductor device of FIG. 12 in accordance with a SIMS (Secondary Ion Mass Spectroscopy) method.
Figure 20:
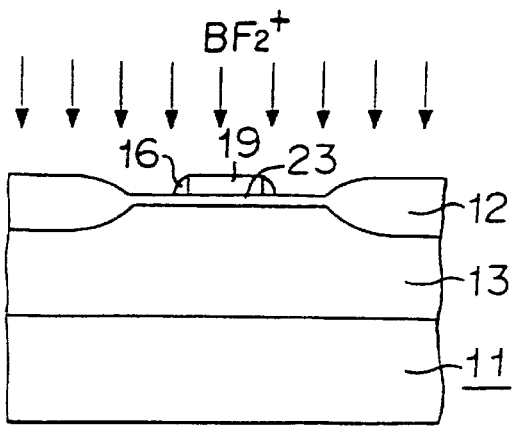
FIG. 20 is a cross-sectional view showing the fabrication process for the semiconductor device of FIG. 17 in the order of the fabrication sequence.
Figure 21:
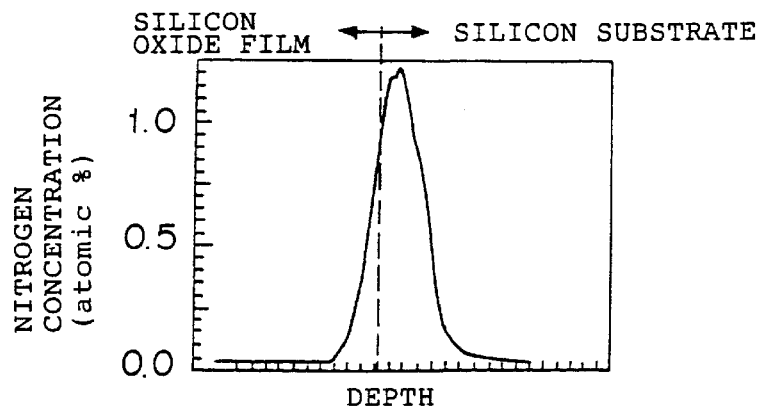
FIG. 21 is a graph showing a measured distribution of nitrogen concentration in the semiconductor device of FIG. 17 in accordance with the SIMS method.
Figure 22:
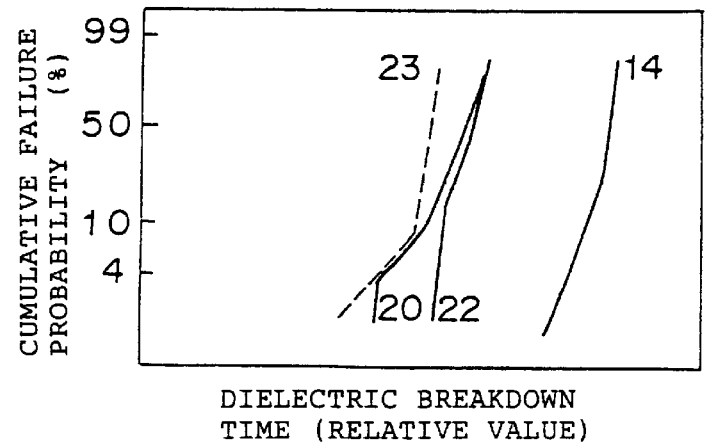
FIG. 22 is graphs measured dielectric breakdown times of the gate oxide films in the conventional semiconductor device.
Figure 26:
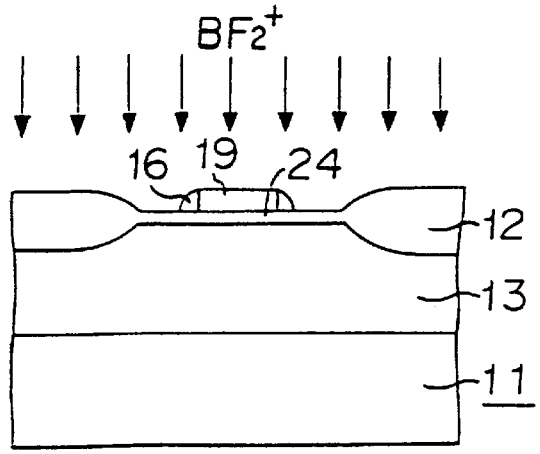
FIG. 26 is a cross-sectional view showing the fabrication process for the improved semiconductor device in the order of the fabrication sequence.
Figure 27:
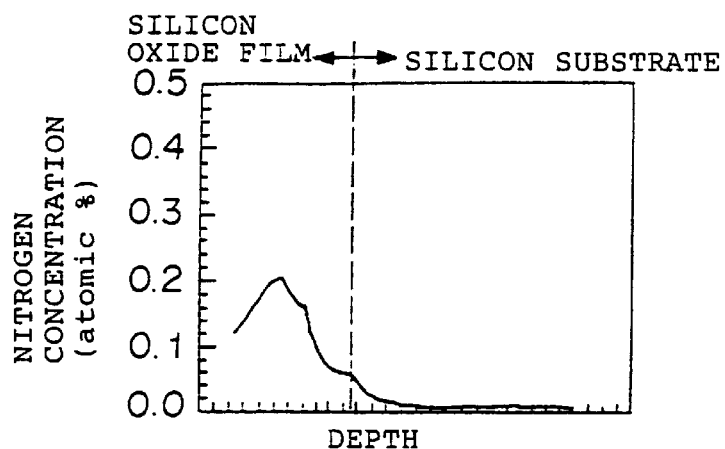
FIG. 27 is a graph showing a distribution of nitrogen concentration in the improvement of FIG. 23 measured by the SIMS method.
Figure 28:
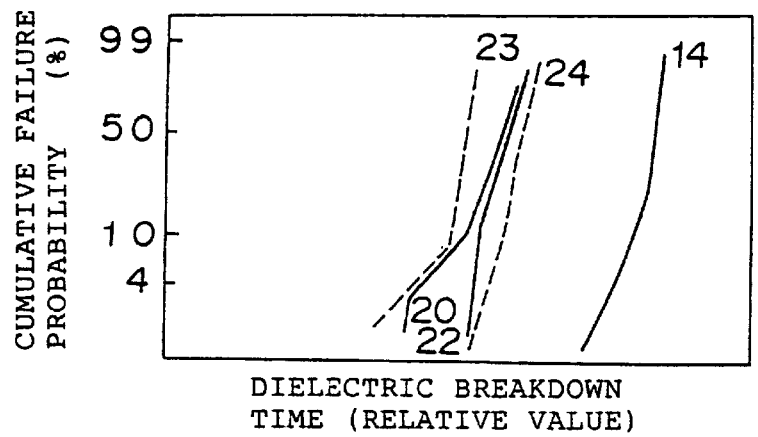
FIG. 28 is a graph showing measured dielectric breakdown times of the gate oxide films in the conventional ones and the improvement.

In FIG. 5, there are shown graphs of measured dielectric breakdown times of the gate oxide films 14, 20, 22, 23 and 24 of the PMOS transistors shown in FIGS. 6, 9, 12, 17 and 23, and of a measured dielectric breakdown time of the gate oxide film 4 of the PMOS transistor shown in FIG. 1. The gate oxide film 14, 20, 22, 23, 24 and 4 had a film thickness of about 60 Å, and the average electric field in the gate oxide films was 12 MV/cm.

As seen from FIG. 5, the dielectric breakdown time of the gate oxide film 4 improved up to the substantially same level as that of the gate oxide film 14 though the dielectric breakdown times of the gate oxide films 20, 22, 23 and 24 lowered in comparison with the gate oxide film 14.

The reasons why the dielectric breakdown time of the gate oxide film 4 improved are supposed as follows:

Considering the report of L. K. Han et al., it is important that the film properties near a gate oxide films/silicon substrate interface are improved with respect to the dielectric breakdown of an oxide film. When boron is diffused into the oxide film near the gate oxide film/silicon substrate interface, the film properties near the gate oxide film/silicon substrate interface is supposed to degrade to deteriorate the dielectric breakdown time.

With respect to the embodiment of the present invention, nitrogen is distributed around a central portion of the gate oxide film 4 which is formed by subjecting the silicon substrate 1 to thermal oxidation in the atmosphere of a mixing gas of $N_2O$ and $O_2$ as shown in FIG. 2(*b*). The nitrogen doped in the gate electrode 5 is diffused and the nitrogen is distributed near an interface between the gate oxide film 4 and the gate electrode 5 by carrying out the heat treatment at 900° C. for 30 minutes in the atmosphere of the $N_2$ gas after doping nitrogen into the polysilicon film 5*a* for the gate electrode as shown in FIG. 3(*b*).

As a result, the gate oxide film 4 has nitrogen distributed in the gate electrode/gate oxide film interface as well as around the central portion of the gate oxide film. In the gate oxide film 4 having such arrangement, the nitrogen which distributes in the gate electrode/gate oxide film interface work as a first barrier against diffusion of boron, and the nitrogen which distributes around the central portion of the gate oxide film works as a second barrier to diffusion of boron into the oxide film near a gate oxide film/silicon substrate interface.

Although the distribution of nitrogen in only the gate electrode/gate oxide film interface or only around the central portion of the gate oxide film like the conventional devices has a low concentration of nitrogen, can not offer a sufficient suppression effect to diffusion of boron and has failed to ensure an enough dielectric breakdown time, the two barriers to diffusion of boron offered by the present invention are supposed to be capable of improving the dielectric breakdown time.

When there is nitrogen introduced into the gate oxide film due to diffusion from the electrode in addition to the nitrogen introduced in the central portion of the gate oxide film by forming the gate oxide film in the atmosphere of the mixing gas of $N_2O$ and $O_2$, it is supposed that the concentration of nitrogen from the central portion of the oxide film to the electrode can be improved to provide a sufficient suppression effect to diffusion of boron.

Although the gate oxide film 4 is formed in the atmosphere of the mixing gas of $N_2O$ and $O_2$ in the embodiment, the gate oxide film may be formed in an atmosphere of an $N_2O$ gas, providing advantageous similar to the embodiment stated earlier.

When the silicon substrate 1 is subjected to thermal oxidation in an atmosphere of a gas of $N_2O$ or a mixing gas of $N_2O$ and $O_2$ at a temperature not higher than 1100° C. at which no crystal effects occurs in the wafer, the upper limit of the concentration of nitrogen in the oxide film 4 is 2 atomic % at the most.

What is claimed is:

1. A semiconductor device comprising:

a silicon substrate having a primary plane;

an insulation film formed on the primary plane of the silicon substrate by subjecting the silicon substrate to thermal oxidation in an atmosphere of a gas of $N_2O$ or a mixing gas of $N_2O$ and $O_2$; and an electrode formed on the insulation film and having nitrogen and a p-type dopant added therein;

wherein nitrogen is distributed in an interface between the insulation film and the electrode and in the central portion of said insulation film to form first and second barriers, respectively, which hinder diffusion of said p-type dopant from said electrode into said insulation film adjacent an interface between said insulation film and said silicon substrate; and wherein the insulating film is a lamp annealed thermal oxidation layer.

2. A semiconductor device comprising:

a silicon substrate having a primary plane;

a silicon oxide film formed on the primary plane of the silicon substrate; and an electrode formed on the oxidation film and having a p-type dopant included therein;

wherein the silicon oxide film has a distribution of nitrogen concentration that peaks around a central portion of the silicon oxide film and near an interface between the silicon oxide film and the electrode to form first and second barriers, respectively, which hinder diffusion of said p-type dopant from said electrode into said silicon oxide film adjacent an interface between said silicon oxide film and said silicon substrate; and wherein the nitrogen concentration around the central portion of the silicon oxide film has a peak value of not higher than 2 atomic %.

3. A semiconductor device according to claim 2, wherein the electrode comprises polysilicon including nitrogen.

\* \* \* \* \*